(12) United States Patent
Hosoi

(10) Patent No.: US 6,341,082 B2
(45) Date of Patent: Jan. 22, 2002

(54) FERROELECTRIC MEMORY CAPABLE OF SUPPRESSING DETERIORATION OF DUMMY CELLS AND DRIVE METHOD THEREFOR

(75) Inventor: Yasunari Hosoi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/796,605

(22) Filed: Mar. 2, 2001

(30) Foreign Application Priority Data

Mar. 6, 2000 (JP) ............................................ 12-059881

(51) Int. Cl.$^7$ ............................................... G11C 11/22
(52) U.S. Cl. .................... 365/145; 365/65; 365/189.07; 365/207
(58) Field of Search ............................ 365/145, 189.07, 365/207, 65, 117

(56) References Cited

U.S. PATENT DOCUMENTS 6,208,550 B1 * 3/2001 Kim ........................... 365/145

FOREIGN PATENT DOCUMENTS

| JP | 2-301093 | 12/1990 |
|----|----------|---------|
| JP | 5-114741 | 5/1993 |
| JP | 7-93978 | 4/1995 |
| JP | 7-192476 | 7/1995 |

* cited by examiner

Primary Examiner—David Nelms
Assistant Examiner—David Lam
(74) Attorney, Agent, or Firm—Nixon & Vanderhye, P.C.

(57) ABSTRACT

A ferroelectric memory has a memory cell array including at least three memory cells composed of a ferroelectric capacitor, and first and second transistors connected in parallel to one electrode of the ferroelectric capacitor, a first bit line to which the ferroelectric capacitors of the memory cells are connected in parallel via the first transistors, and a second bit line to which the ferroelectric capacitors of a plurality of memory cells are connected via the second transistors. The ferroelectric memory has a decision device for comparing a voltage of the first bit line and a voltage of the second bit line to each other to decide whether data is a logical "1" or a logical "0". Thus, deterioration of dummy cells which undergo larger numbers of reads than data cells is suppressed and, as a result, an intermediate voltage can correctly be generated.

9 Claims, 4 Drawing Sheets

(k=1,2,3...n)

FERROELECTRIC MEMORY CAPABLE OF SUPPRESSING DETERIORATION OF DUMMY CELLS AND DRIVE METHOD THEREFOR

BACKGROUND OF THE INVENTION

The present invention relates to a ferroelectric memory and a drive method therefor.

Ferroelectric memories using a ferroelectric as a capacitor have been partly put into practical use, in recent years, by virtue of their features such as nonvolatility and high-speed write/read capabilities.

When electric field is applied to a ferroelectric capacitor iteratively in positive and negative directions, the resulting polarization exhibits a hysteresis loop as shown in FIG. 6, where the axis of abscissas represents applied electric field and the axis of ordinates represents polarization value, showing that the ferroelectric capacitor can have two remanent polarization values of A and C states at an applied electric field of zero. Making these remanent values correspondent to a logical "1" and a logical "0", respectively, allows two-valued logical data to be stored nonvolatile.

For reading data stored in this way, with a voltage applied to the ferroelectric capacitor connected to bit lines, electric charges generated by switching or non-switching of polarization according to stored data are outputted to the bit lines, by which a signal voltage is generated and thus the data reading is achieved. In this case, directions in which the polarization is switched or non-switched are correspondingly associated with the logical "1" and logical "0", respectively. There can be conceived two types of methods for decision of signal voltage.

In a first type, a cell (2T2C) consisting of two ferroelectric capacitors and two transistors is provided to store one piece of logical data. Mutually opposite types of data are stored in the capacitors, where the capacitors are connected to a first bit line and a second bit line, respectively, and a signal voltage of the first bit line and a signal voltage of the second bit line are compared to each other to make a decision.

In a second type, a cell (1T1C) consisting of one ferroelectric capacitors and one transistor is used and a dummy cell for generating a reference voltage is provided, where a signal voltage generated on a first bit line and the reference voltage generated on a second bit line are compared to each other to make a decision. In this case, the reference voltage is desirably an intermediate voltage between the signal voltage of the logical "1" and the signal voltage of logical "0".

For generation of the reference voltage, there have been developed various methods such as one disclosed in Japanese Patent Laid-Open Publications HEI 7-192476 and HEI 7-93978. In this method, two ferroelectric capacitors identical in construction to a memory cell are provided as a dummy cell to store a logical "1" and a logical "0", and voltages resulting from reading the two capacitors are averaged, by which an intermediate voltage is generated. Another method is that, as shown in Japanese Patent Laid-Open Publication HEI 2-301093, the area of a ferroelectric capacitor constituting a dummy cell is made different from the area of a memory cell and a reference voltage is generated by utilizing this. Yet another method is that, as shown in Japanese Patent Laid-Open Publication HEI 5-114741, a capacitor using a normal paraelectric film is used as a dummy cell and an output voltage is increased by utilizing stored charges to provide an intermediate voltage between the signal voltage of a logical "1" and the signal voltage of a logical "0".

The 2T2C type memory cell, in which two transistors and two capacitors are needed for one piece of stored data, is unsuitable for high integration. Also, the 1T1C type memory cell, in which the read margin is one half that of the 2T2C type memory cell, is required to generate signal voltages and a reference voltage with high precision.

However, in the method disclosed in Japanese Patent Laid-Open Publication HEI 2-301093, in which a dummy cell having a capacitor different in electrode area from a memory cell is used, the reference voltage is determined according to a capacitance value at either switching or non-switching of polarization, thus making it difficult to generate an intermediate voltage with high precision. Further, because of differences in ferroelectric capacitor area between data cells and dummy cells, the setting of process conditions becomes difficult due to variations in capacitance characteristics or the like. The case is the same, as to such a problem, also with the method disclosed in Japanese Patent Laid-Open Publication HEI 5-114741.

Furthermore, in the method using two capacitors as a dummy cell as disclosed in Japanese Patent Laid-Open Publications HEI 7-192476 and HEI 7-93978, although it is theoretically possible to generate an intermediate voltage, the dummy cell needs to generate a reference voltage each time data cells connected to the same cell array are read. As a result of this, the number of operations required for the dummy cell becomes quite larger than that required for the data cell. Since a ferroelectric undergoes deteriorations, called imprint and fatigue, that depend on the number of reads, only the dummy cells that undergo larger numbers of reads than data cells would further deteriorate, making it impossible to correctly generate an intermediate voltage.

SUMMARY OF THE INVENTION

Therefore, an object of the present invention is to provide a ferroelectric memory being capable of suppressing deterioration of dummy cells undergo larger number of reads than data cells and generating an intermediate voltage correctly.

In order to achieve the above object, there is provided a ferroelectric memory comprising:

a memory cell array having at least three or more memory cells ($FS_k$) each of which comprises a ferroelectric capacitor ($FC_k$) for storing a logical "1" or a logical "0" depending on a direction of spontaneous polarization, and a first transistor ($TA_k$) and a second transistor ($TB_k$) connected in parallel to one electrode of the ferroelectric capacitor ($FC_k$);

a first bit line (BLA) to which the ferroelectric capacitors (FCk) of the memory cells are connected in parallel via the first transistors ($TA_k$);

a second bit line (BLB) to which the ferroelectric capacitors ($FC_k$) of a plurality of memory cells are connected via the second transistors ($TB_k$); and a decision device for comparing a voltage of the first bit line (BLA) and a voltage of the second bit line (BLB) to each other to decide whether data is a logical "1" or a logical "0".

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

(Embodiment 1)

Figure 1A:
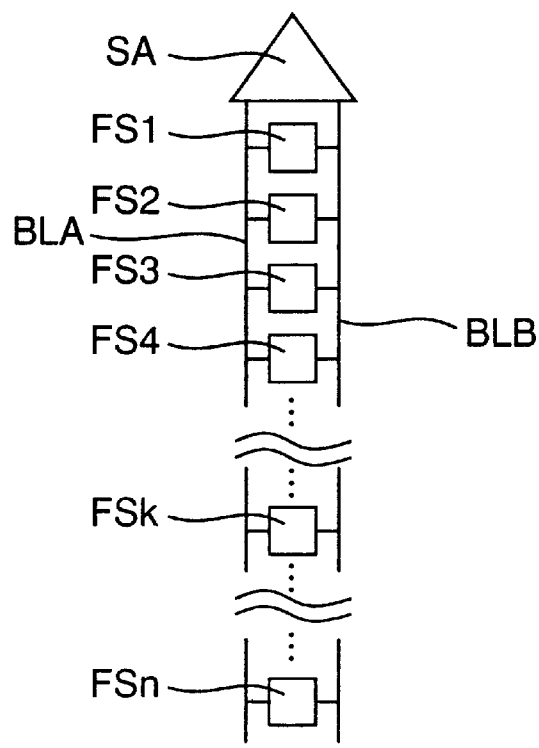
FIGS. 1 and 1B are views showing a cell array and the construction of a cell, respectively, in the structure of a ferroelectric memory according to the invention.
Figure 1B:
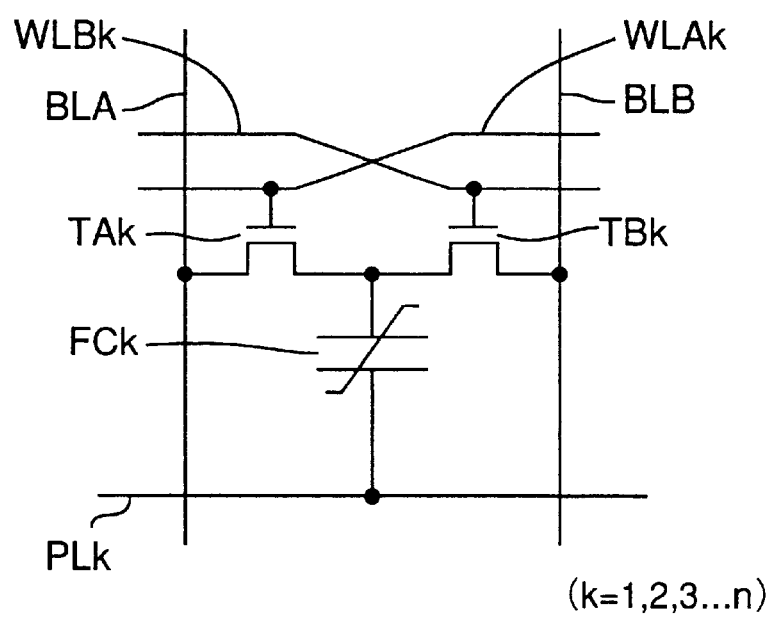

FIGS. 1A and 1B represent a cell array in this invention and the basic construction of each of the cells constituting the cell array, respectively. FIG. 1A shows the basic structure of a cell array, where a sense amplifier SA is connected to paired bit lines BLA and BLB, and n cells FS1, FS2, . . . FSn are connected to both bit lines. FIG. 1B shows the basic structure of a cell FSk in the invention, where a plate line PLk is connected to one-side electrode of one ferroelectric capacitor FCk while the other electrode is connected to the bit line BLA and the bit line BLB via a transistor TAk and a transistor TBK, respectively. Word lines WLAk, WLBk are connected to gate electrodes of transistors TAk, TBk, respectively.

Figure 2:
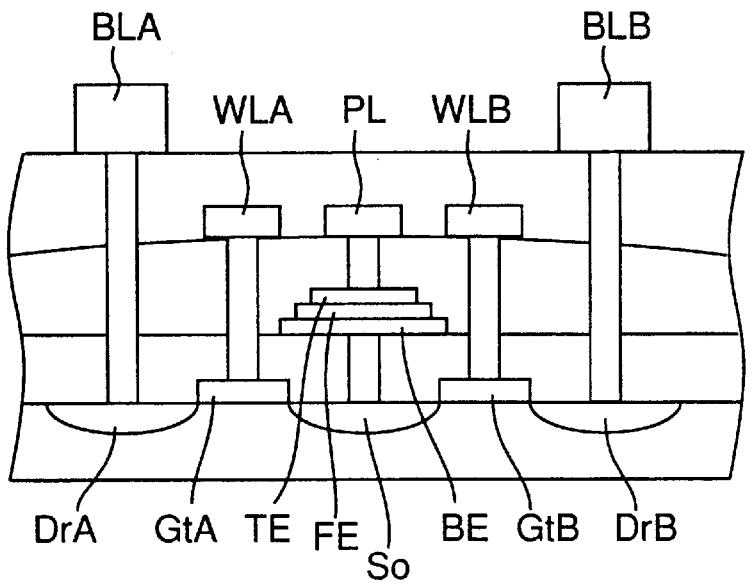
FIG. 2 is a sectional view of an example of the cell structure of the ferroelectric memory according to the invention.

FIG. 2 is a view showing the cross-sectional structure of the memory cell. A ferroelectric capacitor is so structured that a ferroelectric insulating film FE is sandwiched between a lower electrode BE and an upper electrode TE, where the upper electrode TE is connected to a plate line PL and the lower electrode BE is connected to the source region So of the transistor. As the ferroelectric material, $SrBi_2Ta_2O_9$ (hereinafter, referred to as SBT) was used, and as the electrode material, iridium (Ir) was used for the upper electrode, and iridium and tantalum-silicon nitride (TaSiN) was used for the lower electrode. SBT, having a large remanent polarization value (remanence)., was associated with logical binary-information on the assumption that a logical "1" is assigned to the direction in which spontaneous polarization is switched and a logical "0" is assigned to the direction in which spontaneous polarization is not switched.

The transistor has one source region, two gate electrodes GtA, GtB and two drain regions DrA, DrB, where the gate electrodes GtA, GtB are connected to the word lines WLA, WLB, respectively, and the drain regions DrA, DrB are connected to the bit lines BLA, BLB, respectively.

The method for driving the ferroelectric memory having the structure of FIGS. 1A and 1B according to the first embodiment of the invention is described below.

Previously, the cell FS1 has stored logical "0" data and the cell FS2 has stored logical "1" data, these cells having been selected as reference cells. For reading logical data stored in the cell FS3, word lines WLA1, WLA2 are selected so that the transistors TA1, TA2 are turned ON, causing the plate lines PL1, PL2 to go High state. Thus, the cells FS1, FS2 are short-circuited to the bit line BLA, thereby generating a reference voltage Vref. Wiring capacity of the bit line BLA and wiring capacity of the bit line BLB being different from each other, it was set in this case that the wiring capacity of the bit line BLA would be twice the wiring capacity of the bit line BLB. The reference voltage Vref generated in this way becomes an intermediate voltage between a signal voltage VDL1 for a logical "1" generated on the bit line BLB and a signal voltage VDL0 for a logical "0".

Further, with the word line WLB3 selected, the transistor TB3 is turned ON and the plate line PL3 is put into High state, by which a signal voltage is generated on the bit line BLB.

Thereafter, a difference between the voltage of the bit line BLA (reference voltage) and the voltage of the bit line BLB (signal voltage) is sensed and amplified by the sense amplifier SA. Subsequently, data of a logical "1" and a logical "0" are stored into the reference cells FS1 and FS2, respectively, once again, thus completing the read operation.

Either the process for generating a reference voltage or the process for generating a signal voltage, whichever it is, may be done first, or otherwise those processes may be done simultaneously. Besides, it may be the cell FS1 that stores logical "1" data after the amplification by the sense amplifier.

(Embodiment 2)

Figure 3:
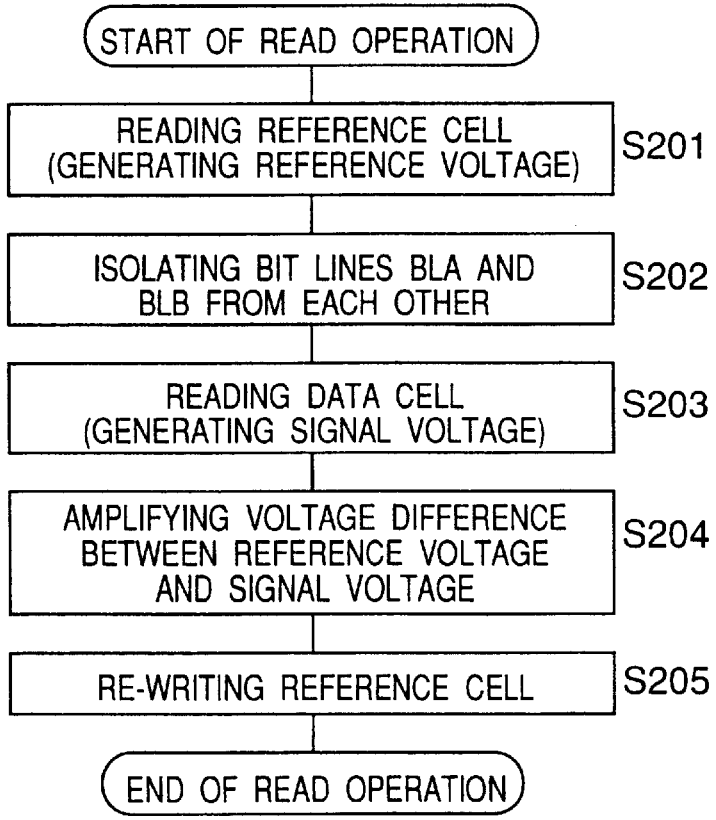
FIG. 3 is a chart showing the operational flow of Embodiment 2 of the invention.

FIG. 3 shows an embodiment showing the operational flow in the invention. Cell array and memory cell structure used in this embodiment are similar to those shown in FIGS. 1A and 1B.

The driving method based on the operational flow shown in FIG. 3 is described below.

Referring to FIGS. 1A and 1B, previously, the cell FS1 has stored logical "0" 1 data and the cell FS2 has stored logical "1" data, these cells having been selected as reference cells. For reading logical data stored in the cell FS3, word lines WLA1, WLA2, WLB1, WLB2 are selected so that the transistors TA1, TA2, TB1, TB2 are turned ON, by which the bit lines BLA and BLB are short-circuited to each other, causing the plate lines PL1, PL2 to go High state. Thus, a reference voltage Vref is generated on the bit lines BLA and BLB (S201 in FIG. 3). It was set in this case that the wiring capacity of the bit line BLA and the wiring capacity of the bit line BLB would be equal to each other. The reference voltage Vref generated in this way becomes an intermediate voltage between a signal voltage VDL1 for a logical "1" generated on the bit line BLB and a signal voltage VDL0 for a logical "0".

After the reference voltage is generated, the transistors TA1, TA2, TB1, TB2 are turned OFF, making the bit lines BLA, BLB electrically isolated from each other (S202 in FIG. 3). Subsequently, the word line WLB3 is selected, the transistor TB3 is turned ON, and the plate line PL3 is put into High state, by which a signal voltage is generated on the bit line BLB (S203 in FIG. 3).

Next, a difference between the voltage of the bit line BLA (reference voltage) and the voltage of the bit line BLB (signal voltage) is sensed and amplified by the sense amplifier SA (S204 in FIG. 3). Subsequently, data of a logical "1" is stored into the reference cell FS2 once again, thus completing the read operation (S205 in FIG. 3). In this case, it may be the cell FS1 that stores logical "1" data after the amplification by the sense amplifier. Also, it may be at least one of TA1 and TA2, and at least one of TB1 and TB2 that is turned OFF at S202.

As shown above, Embodiments 1 and 2 have features different from each other. More specifically, in the drive method shown in Embodiment 1, since the process for generating a reference voltage and the process for generating a signal voltage can be performed simultaneously, high-speed access is enabled. In the drive method shown in Embodiment 2, since the paired bit lines BLA and BLB can be made equal in wiring capacity to each other, the setting of process conditions is facilitated. Further, although SBT is used as the ferroelectric material and iridium and tantalum-silicon nitride are used as the electrode material in this embodiment, any combination of materials showing ferroelectric characteristics may be used without limitation to the above.

(Embodiment 3)

Figure 4:
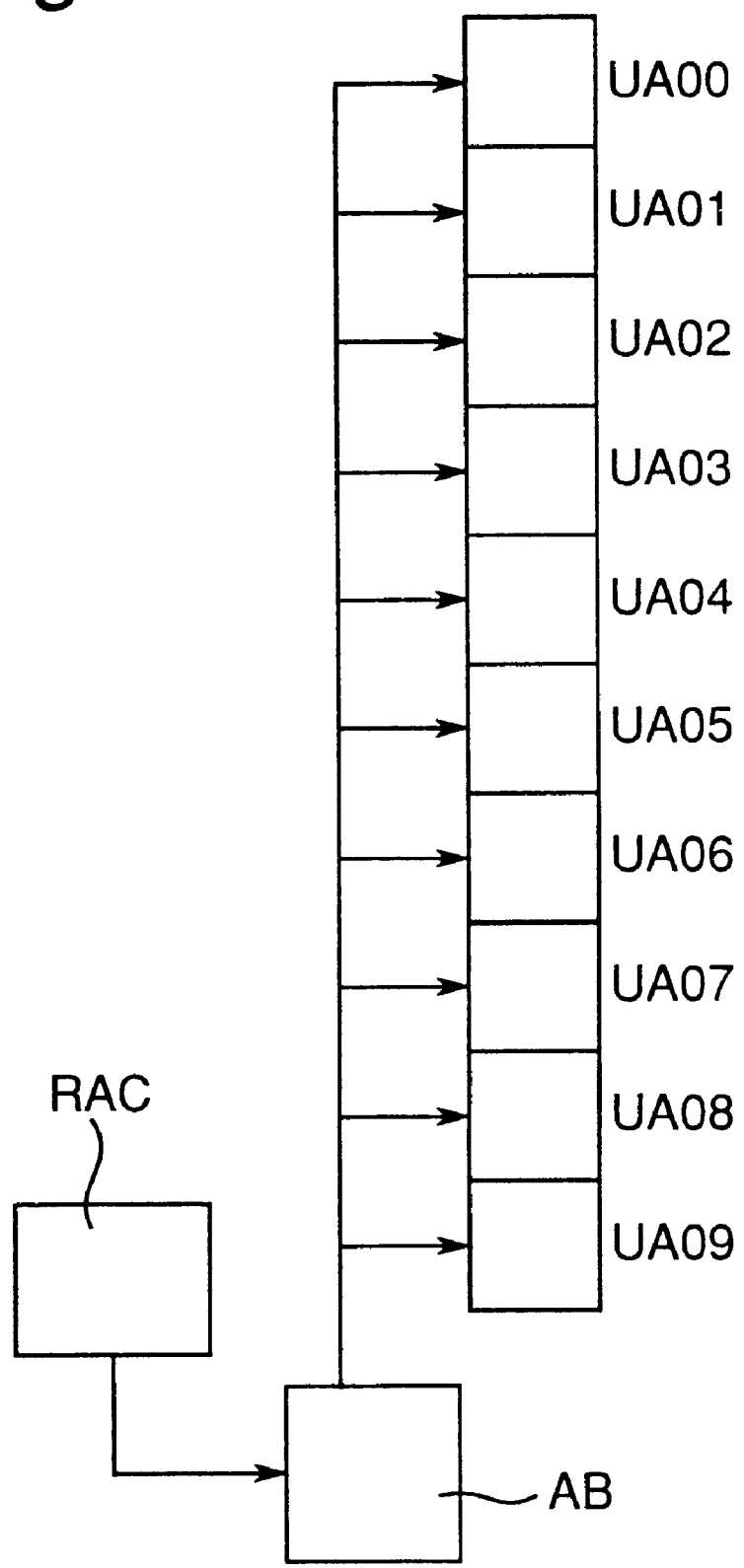
FIG. 4 is a block diagram showing the structure of the ferroelectric memory according to the invention.

FIG. 4 shows a schematic block diagram of the ferroelectric memory according to the invention. In this embodiment, one cell array is composed of ten ferroelectric memory cells UA00–UA09. An address selection means AB includes a reference cell address storage means, a means for selecting addresses of a reference cell and a read-object data cell, and an interchange circuit for the reference cell and the data cell and executes read and write operations of the ferroelectric memory.

A reference cell address conversion means RAC includes an access counter means for counting the number of reads effected on the cell array, and an interchange operation start signal output means.

Figure 5:
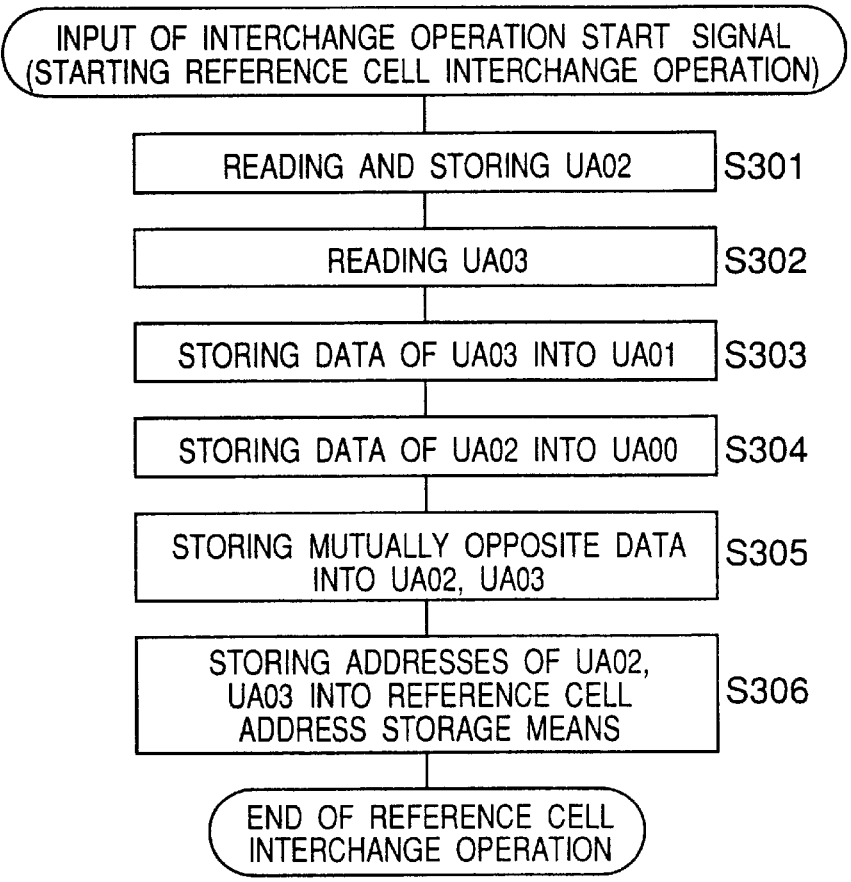
FIG. 5 is a view showing the operational flow of Embodiment 3 of the invention.
Figure 6:
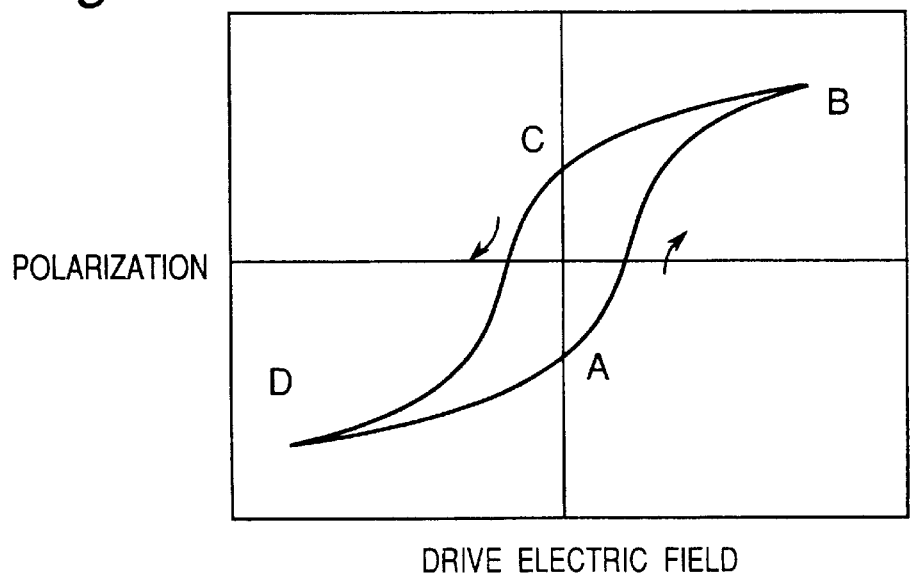
FIG. 6 is a chart showing a hysteresis loop of a ferroelectric.

FIG. 5 shows an operational flow of interchange operation of a reference cell in the invention. In the operational flow of FIG. 5, the memory cells UA00 and UA01 are taken as reference cells before the interchange operation, while the memory cells UA02 and UA03 have each stored data of a logical "1" or a logical "0". In this embodiment, when the access counter reads a value of the sixteenth power of 2, the reference cell address conversion means RAC outputs an interchange operation start signal to the address selection means AB, making the interchange operation between reference cells and data cells started.

The address selection means AB, taking the memory cells UA00 and UA01 as reference cells, selects the memory cell UA02 as a data cell to be read, and performs a read operation shown in Embodiment 1 or Embodiment 2, storing the read data into an unshown storage area ADRO (S301). Subsequently, likewise, the address selection means AB, taking the memory cells UA00 and UA01 as reference cells, selects the memory cell UA03 as a data cell to be read, and reads the cell similarly (S302).

Data of the read memory cell UA03 is stored into the memory cell UA01 (S303). Next, data of the memory cell UA02 stored into the storage area ADRO is stored into the memory cell UA00 (S304). Subsequently, data opposite to each other are stored into the memory cells UA02 and UA03 (S305), and addresses of the memory cells UA02 and UA03 are stored into the reference cell address storage means of the address selection means AB (S306).

It is assumed that access from external to the cell array is inhibited during the interchange operation. Also, although the reference number of times of accesses for interchange operation is set to the sixteenth power of 2 in this embodiment, the present invention is not limited to this and, desirably, the reference number of times of accesses is set to not more than one third of the number of times of accesses that allows the reliability of the ferroelectric memory cells to be maintained. Further, although the cell array has ten memory cells by way of example for description of this embodiment, the present invention is not limited to this and may also be applied to larger-scale memories.

Although the number of times of accesses is taken as the reference for interchange operation start in this embodiment, it is also possible to further provide a means for deciding the degree of fatigue of reference cells such as time counting means or spontaneous polarization comparing means so that the interchange is executed depending on the elapsed time after the interchange or the degree of fatigue of the ferroelectric characteristics of reference cells.

Although the above description has been made with regard to a single cell array in this embodiment, it is also possible that reference cells for a plurality of cell arrays and data cells are interchanged simultaneously or sequentially by counting the number of times of accesses or the time of access to a plurality of cell arrays. Although SBT is used as the ferroelectric material in this embodiment, materials showing ferroelectricity such as $Pb(Zr_xTi_{1-x})O_3$(PZT) are also applicable. Further, although iridium is used for the upper electrode and a stacked structure of iridium and tantalum-silicon nitride is used for the lower electrode, other electrode materials may also be used.

As described above in detail, by adoption of the present invention, reliability retention is enabled for numbers of times of reads not less than the eleventh power of 10 times without causing any extreme concentrations of the number of times of accesses on particular cells in the cell array. Accordingly, the substantial number of times of accesses can be increased to a large extent, elongating the life of the ferroelectric memory, i.e. the available period, so that its reliability can be enhanced.

By the setting that the wiring capacity of bit lines to which a reference voltage is generated is set twice the wiring capacity of bit lines to which a signal voltage is generated, the process of generating the reference voltage and the process of generating the signal voltage can be performed simultaneously, which enables high-speed access. Further, by the setting that the bit line to which the reference voltage is generated and the bit line to which the signal voltage is generated are made equal in wiring capacity to each other, the setting of process conditions is facilitated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A ferroelectric memory comprising:
    a memory cell array having at least three or more memory cells each of which comprises a ferroelectric capacitor for storing a logical "1" or a logical "0" depending on a direction of spontaneous polarization, and a first transistor and a second transistor connected in parallel to one electrode of the ferroelectric capacitor;
    a first bit line to which the ferroelectric capacitors of the memory cells are connected in parallel via the first transistors;
    a second bit line to which the ferroelectric capacitors of a plurality of memory cells are connected via the second transistors; and
    a decision device for comparing a voltage of the first bit line and a voltage of the second bit line to each other to decide whether data is a logical "1" or a logical "0".

2. The ferroelectric memory according to claim 1, further comprising means for short-circuiting, to the first bit line, one pair of memory cells, among the memory cells, composed of a memory cell having a logical "1" stored therein and a memory cell having a logical "0" stored therein so that the pair of memory cells serves as a reference cell pair for generating a reference voltage, for storing the other data cell, as a data cell, with data of a logical "1" or a logical "0", and for generating a voltage of the reference cells on the first bit line and further generating a voltage of the data cell on the second bit line.

3. The ferroelectric memory according to claim 2, further comprising selection means for selecting arbitrary two memory cells, from among memory cells constituting a memory cell array, as memory cells composing the reference cell pair.

4. The ferroelectric memory according to claim 3, further comprising decision means for deciding a degree of fatigue of the reference cell pair.

5. The ferroelectric memory according to claim 4, wherein the decision means for deciding the degree of fatigue counts a number of times of accesses to a memory cell array, or counts access time to a memory cell array, or measures a degree of spontaneous polarization.

6. The ferroelectric memory according to claim 1, wherein a wiring capacity ratio of the first bit line to the second bit line is 1/2.

7. A ferroelectric memory driving method for performing a read operation from the ferroelectric memory as defined in claim 6, the method comprising the steps of:
- turning ON first transistors of the reference cells to generate a reference voltage of the capacitors of a reference cell pair on the first bit line;
- generating a data voltage of a selected data cell on the second bit line; and
- comparing a difference between the reference voltage and the data voltage to decide whether data of the data cell is a logical "1" or a logical "0".

8. The ferroelectric memory according to claim 1, wherein the first bit line and the second bit line are equal in wiring capacity to each other.

9. A ferroelectric memory driving method for performing a read operation from the ferroelectric memory as defined in claim 8, the method comprising the steps of:
- turning ON the first transistor and the second transistor of the reference cells to electrically connect the first bit line and the second bit line to each other and generate a reference voltage on the first bit line and the second bit line;
- turning OFF either one of the first transistor and the second transistor of each reference cell to electrically isolate the first bit line and the second bit line from each other;
- generating a data voltage of a selected data cell on the second bit line; and
- comparing a difference between the reference voltage and the data voltage to decide whether data of the data cell is a logical "1" or a logical "0".

* * * * *